(12) United States Patent  
Kim et al.

(10) Patent No.: US 9,088,151 B2
(45) Date of Patent: Jul. 21, 2015

(54) POWER MODULE INCLUDING LEAKAGE CURRENT PROTECTION CIRCUIT

(71) Applicant: Samsung Electronics Co., Ltd., Suwon-Si, Gyeonggi-Do (KR)

(72) Inventors: Ho-jung Kim, Suwon-si (KR); Jai-kwang Shin, Anyang-si (KR); U-in Chung, Seoul (KR); Hyun-sik Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 13/737,217

(22) Filed: Jan. 9, 2013

(65) Prior Publication Data

US 2013/0241604 A1    Sep. 19, 2013

(30) Foreign Application Priority Data

Mar. 14, 2012   (KR) .......................... 10-2012-0026201

(51) Int. Cl.
| | |
|---|---|
| *G05F 3/02* | (2006.01) |
| *G01F 1/10* | (2006.01) |
| *H02H 9/02* | (2006.01) |
| *H03K 17/56* | (2006.01) |
| *H03K 17/16* | (2006.01) |

(52) U.S. Cl.
CPC ............... *H02H 9/02* (2013.01); *H03K 17/165* (2013.01); *H03K 17/56* (2013.01); *H01L 2924/0002* (2013.01); *H03K 2217/0036* (2013.01)

(58) Field of Classification Search
CPC ..... H03K 19/0016; G06F 1/3203; G06F 1/32; G06F 1/3296; G11C 5/147
USPC .................. 327/427, 434, 109, 544, 170, 108
See application file for complete search history.

(56) References Cited

U.S. PATENT DOCUMENTS

| | | | |
|---|---|---|---|
| 6,094,365 A | 7/2000 | Chiao | |
| 6,356,121 B1 * | 3/2002 | Garnier | ............................ 327/66 |
| 6,906,574 B2 * | 6/2005 | Ohi et al. | ........................ 327/392 |
| 7,158,594 B2 * | 1/2007 | Griffin et al. | .................. 375/354 |
| 7,218,164 B2 * | 5/2007 | Vitale et al. | ..................... 327/376 |
| 7,224,191 B1 * | 5/2007 | Wang et al. | ...................... 327/60 |
| 7,292,083 B1 * | 11/2007 | Wang et al. | .................... 327/205 |
| 8,035,363 B2 * | 10/2011 | Joos et al. | ....................... 323/282 |
| 8,183,891 B2 * | 5/2012 | Naganawa | .................... 327/108 |
| 8,791,648 B2 * | 7/2014 | Luo et al. | ....................... 315/291 |
| 2002/0171455 A1 * | 11/2002 | Tsuchida et al. | ............... 327/108 |
| 2009/0315078 A1 | 12/2009 | Parikh et al. | |
| 2010/0188121 A1 | 7/2010 | Jung | |

FOREIGN PATENT DOCUMENTS

| | | |
|---|---|---|
| JP | 2003070231 A | 3/2003 |
| JP | 2005012681 A | 1/2005 |
| JP | 2005184928 A | 7/2005 |

* cited by examiner

*Primary Examiner* — Quan Tra

(74) *Attorney, Agent, or Firm* — Harness, Dickey & Pierce, P.L.C.

(57) ABSTRACT

A power module including a power device and a periphery circuit configured to suppress a leakage current in the power device. The periphery circuit includes a leakage current detection circuit configured to detect a leakage current from the power device and control operation of the power device based on a result of the detection. The leakage current detection circuit including an input terminal connected to the power device, a plurality of NMOS transistors, a plurality of PMOS transistors connected to the plurality of NMOS transistors, and a comparator.

14 Claims, 4 Drawing Sheets

POWER MODULE INCLUDING LEAKAGE CURRENT PROTECTION CIRCUIT

CROSS-REFERENCE TO RELATED APPLICATIONS

This application claims the benefit of Korean Patent Application No. 10-2012-0026201, filed on Mar. 14, 2012, in the Korean Intellectual Property Office, the disclosure of which is incorporated herein in its entirety by reference.

BACKGROUND

1. Field

The present disclosure relates to a module including a power device, and more particularly, to a power device module (a power module) including a leakage current protection circuit.

2. Description of the Related Art

A common metal oxide semiconductor field-effect transistor (MOSFET) or an insulated-gate bipolar transistor (IGBT) includes various protection circuits for operation, such as a de-saturation circuit, an under voltage lock-out (UVLO) circuit, an over voltage circuit, or a soft turn-off circuit. However, a common MOSFET or IGBT does not experience problems related to a gate leakage current and thus generally does not need a separate protection circuit.

In contrast, in a power device, for example, a high electron mobility transistor (HEMT), a gate leakage current may occur. Accordingly, various methods are suggested to resolve a leakage current, but most of the solutions involve changes to the manufacturing process or structural changes to the power device itself.

SUMMARY

Provided is a power module for preventing occurrence of a leakage current over a critical value.

Additional aspects will be set forth in part in the description which follows and, in part, will be apparent from the description, or may be learned by practice of the presented embodiments.

According to an example embodiment, a power module may include a power device and a periphery circuit configured to suppress a leakage current in the power device. The periphery circuit may include a leakage current detection circuit configured to detect a leakage current from the power device and control operation of the power device based on a result of the detection, the leakage current detection circuit including an input terminal connected to the power device, a plurality of NMOS transistors, a plurality of PMOS transistors connected to the plurality of NMOS transistors, and a comparator.

In one embodiment, the leakage current detection circuit generates a control signal to stop the operation of the power device, if the result of the detection indicates that the leakage current has reached an undesired level.

In one embodiment, the periphery circuit further includes a control block configured to generate a driver signal in response to a control signal, a gate driver configured to selectively generate a driving voltage based on the driver signal, and a Complementary Metal Oxide Semiconductor (CMOS) circuit configured to drive the power device based on the driving voltage.

In one embodiment, the leakage current detection circuit includes a first circuit unit connected to a first input terminal of the comparator and a second circuit unit connected to a second input terminal of the comparator.

In one embodiment, the first circuit unit includes two NMOS transistors and two PMOS transistors, wherein a gate voltage at a gate of the power device is applied to a gate of one of the two NMOS transistors and a first reference voltage is applied to a gate of the remaining NMOS transistor.

In one embodiment, the second circuit unit includes two NMOS transistors and two PMOS transistors, wherein a source voltage at a source of the power device is applied to a gate of one of the two NMOS transistors, and a second reference voltage lower than the first reference voltage is applied to a gate of the remaining NMOS transistor.

In one embodiment, the leakage current detection circuit includes three NMOS transistors and three PMOS transistors respectively connected to the NMOS transistors, wherein a first one of the three NMOS transistors has a gate connected to a gate of the power device and a second one of the three NMOS transistors has a gate connected to the source of the power device, and a voltage applied to the gate of the first one of the three NMOS transistors is different from the voltage applied to the gate of the second one of the three NMOS transistors, and a bias voltage is applied to a gate of a third one of the three NMOS transistors.

In one embodiment, the first circuit unit includes a first NMOS transistor having a source, a drain and a gate, the gate of the first NMOS transistor connected to a gate of the power device and having a gate voltage applied thereto; a second NMOS transistor having a source, a drain and a gate, the source of the second NMOS transistor connected to the source of the first NMOS transistor and the gate of the second NMOS transistor having a first reference voltage applied thereto; a first PMOS transistor having a source connected to the drain of the first NMOS transistor; and a second PMOS transistor having a source connected to the drain of the second NMOS transistor.

In one embodiment, the second circuit unit includes a third NMOS transistor having a source, a drain and a gate, the gate of the third NMOS transistor connected to the source of the power device and having a source voltage applied thereto; a fourth NMOS transistor having a source, a drain and a gate, the source of the fourth NMOS transistor connected to the source of the third NMOS transistor and the gate of the fourth NMOS transistor having a second reference voltage applied thereto, the second reference voltage being a voltage level that is less than the first reference voltage; a third PMOS transistor having a source connected to the drain of the third NMOS transistor; and a fourth PMOS transistor having a source connected to the drain of the fourth NMOS transistor.

In one embodiment, the leakage current detection circuit includes a first, second and third NMOS transistor; a first PMOS transistor connected to the first NMOS transistor; a second PMOS transistor connected to the second NMOS transistor; and a third PMOS transistor connected to the third NMOS transistor. A first input of the comparator is connected to the first NMOS transistor and the first PMOS transistor and a second input of the comparator is connected to the second NMOS transistor and the second PMOS transistor. The first NMOS transistor has a gate connected to a gate of the power device and the second NMOS transistor has a gate connected to the source of the power device. A voltage applied to the gate of the first NMOS transistor is different from the voltage applied to the second NMOS transistor. A bias voltage is applied to a gate of the third NMOS transistor.

In one embodiment, a width of a channel of one of the first NMOS transistor and the second NMOS transistor having a greater gate voltage applied thereto is less than the width of the channel of a remaining one of the first NMOS transistor and the second NMOS transistor.

In one embodiment, a length of a channel of one of the first NMOS transistor and the second NMOS transistor to which a greater gate voltage is applied is longer than the length of the channel of a remaining one of the first NMOS transistor and the second NMOS transistor.

In one embodiment, the leakage current detection circuit includes a first and second NMOS transistor; a first PMOS transistor connected to the first NMOS transistor; and a second PMOS transistor connected to the second NMOS transistor. The comparator has one input terminal, and the first PMOS transistor and the first NMOS transistor are connected to the one input terminal of the comparator.

In one embodiment, a width of a channel of one of the first NMOS transistor and the second NMOS transistor having a greater voltage applied thereto is less than the width of the channel of a remaining one of the first NMOS transistor and the second NMOS transistor.

In one embodiment, a length of a channel of one of the first NMOS transistor and the second NMOS transistor having a greater voltage applied thereto is longer than the length of the channel of the remaining one of the first NMOS transistor and the second NMOS transistor.

At least one example embodiment relates to a power module.

In one embodiment, the power device has a gate connected to an element; and a periphery circuit configured to suppress a leakage current generated by the power device. The periphery circuit including a leakage current detection circuit configured to detect a leakage current from the power device and control operation of the power device based on a result of the detection, the leakage current detection circuit including input terminals connected to the element, a plurality of resistors each having different resistances, and a comparator having first and second input terminals connected between the plurality of resistors.

In one embodiment, the leakage current detection circuit generates a control signal to stop the operation of the power device, if the result of the detection indicates that the leakage current has reached an undesired level.

In one embodiment, the periphery circuit further includes, a control block configured to generate a driver signal in response to a control signal; a gate driver configured selectively generate a driving voltage based on the driver signal, and a Complementary Metal Oxide Semiconductor (CMOS) circuit configured to drive the power device based on the driving voltage.

In one embodiment, the plurality of resistors includes first and second resistors directly connected to each other; and third and fourth resistors directly connected to each other, wherein the first input terminal of the comparator is connected between the first and second resistors and the second input terminal is connected between the third and fourth resistors.

In one embodiment, the first resistor is connected to a first point of the element and the third resistor is connected to a second point of the element, and a potential of the element at the first point is different than a potential of the element at the second point.

In one embodiment, the element is a voltage drop element connected between the first point and the second point.

In one embodiment, the voltage drop element is one of a resistor and a transistor.

In one embodiment, a value of a resistance of the first resistor is different from a value of the resistance of the third resistor.

In one embodiment, a value of a resistance of the second resistor is different from a value of the resistance of the fourth resistor.

As described above, a power module according to the one or more of the above embodiments includes a gate leakage current protection circuit. Thus, elements related to operation of the power module (i.e., a gate driver) as well as a power device may be protected by detecting a leakage current generated from the power device being equal to or greater than a critical leakage current. Therefore, reliability of operation of a power device and a power module may be increased as operation of the power device and the power module may be maintained stable.

BRIEF DESCRIPTION OF THE DRAWINGS

These and/or other aspects will become apparent and more readily appreciated from the following description of the example embodiments, taken in conjunction with the accompanying drawings of which.

DETAILED DESCRIPTION

Figure 1:
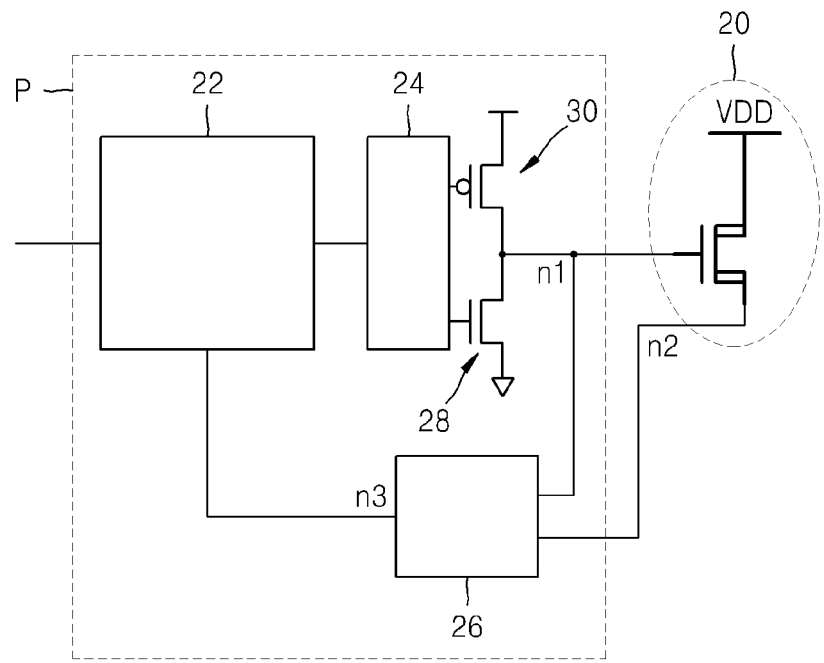
FIG. 1 illustrates a power device module including a power device protection circuit according to an example embodiment of the present.

Reference will now be made in detail to example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments of the invention are shown. In the drawings, the thicknesses of layers and regions are exaggerated for clarity.

Hereinafter, a power device module including a power device protection circuit according to embodiments will be described in detail by explaining preferred embodiments of the invention with reference to the attached drawings. In the drawings, the thicknesses of layers and regions are exaggerated for clarity.

FIG. 1 illustrates a power device module including a power device protection circuit according to an example embodiment (hereinafter, referred to as a "first power device module").

Referring to FIG. 1, the first power device module includes a power device 20 and a periphery circuit P. The periphery circuit P includes a control block 22, a gate driver 24, first and second transistors 28 and 30, and a gate leakage current detector 26. The control block 22 controls operation of the gate driver 24 according to a signal received from the gate leakage current detector 26. The operation of the gate driver 24 is controlled by a control signal received from the control block 22. The gate driver 24 applies a gate voltage to the power device 20 via the first and second transistors 28 and 30, and is turned on or off according to the control signal received from the control block 22. The first transistor 28 may be an N-type metal oxide semiconductor (MOS) transistor and the second transistor 30 may be a P-type MOS transistor. The first and second transistors 28 and 30 may form a CMOS circuit. The power device 20 may be, for example, a high electron mobility transistor (HEMT).

The control block 22 is connected to the power device 20 via the gate driver 24. That is, the gate driver 24 is disposed between the control block 22 and the power device 20. The gate driver 24 is not directly connected to the gate leakage current detector 26. The first and second transistors 28 and 30 are disposed between the gate driver 24 and the power device 20 such that the gate driver 24 is connected to the power device 20 through gates of the first and second transistors 28 and 30. The first and second transistors 28 and 30 may be connected in parallel to the gate driver 24.

The gate leakage current detector 26 is disposed between the control block 22 and the power device 20. An output terminal of the gate leakage current detector 26 is connected to the control block 22. One of two input terminals of the gate leakage current detector 26 is connected to a source of the power device 20, and another input terminal is connected between the first and second transistors 28 and 30 and a gate of the power device 20. The gate leakage current detector 26 measures a voltage between the gate and the source of the power device 20 and transmits a control signal to the control block 22 when the measured voltage reaches a desired (or alternatively, a predetermined) voltage or greater, and the control block 22 turns off the operation of the gate driver 24 in response to the control signal. As a result, the first power device module may be protected from a leakage current since current leakage from the power device 20 is suspended. The desired (or alternatively, the predetermined) voltage is a voltage at which the leakage current of the power device 20 reaches a critical value or greater.

Figure 2:
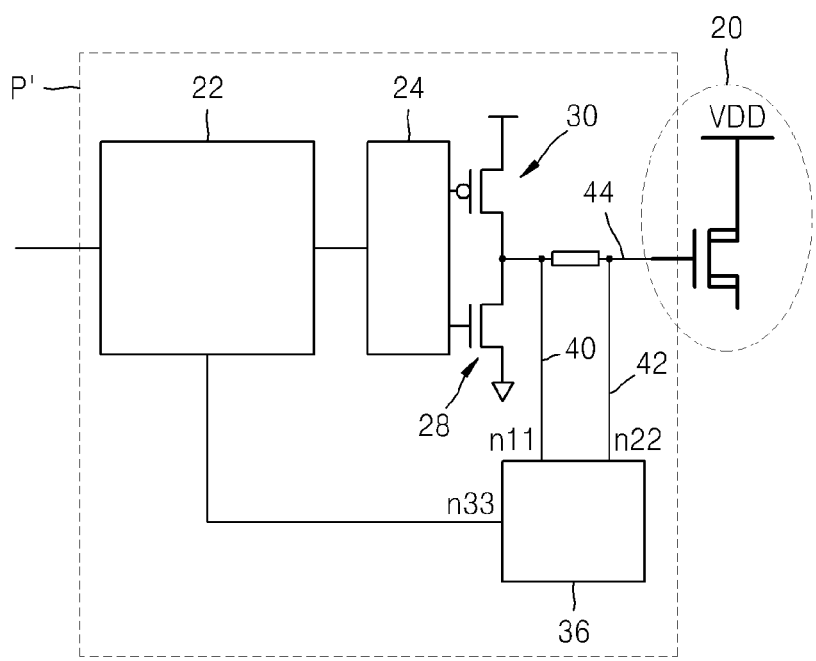
FIG. 2 illustrates a power device module including a power device protection circuit according to another example embodiment.

FIG. 2 illustrates a power device module including a power device protection circuit according to another example embodiment (hereinafter, referred to as a second power device module).

The second power device module includes the power device 20 and a second periphery circuit P'. The second periphery circuit P' includes a second gate leakage current detector 36, the control block 22, the gate driver 24, the first and second transistors 28 and 30. The second gate leakage current detector 36 includes an output terminal connected to the control block 22 and first and second input terminals 40 and 42 connected to an element 44, such as a wiring, that connects the first and second transistors 28 and 30 to the gate of the power device 20. The first and second input terminals 40 and 42 may be connected to the element 44 at different locations. A voltage drop element 46 may be disposed on the element 44 between the first and second input terminals 40 and 42 for measuring the current flowing across the voltage drop element 46. The second gate leakage current detector 36 measures a current flowing between the first and second transistors 28 and 30 and the gate of the power device 20.

The remaining components of the second power device module of FIG. 2 are the same as those of the first power device module of FIG. 1.

Figure 3:
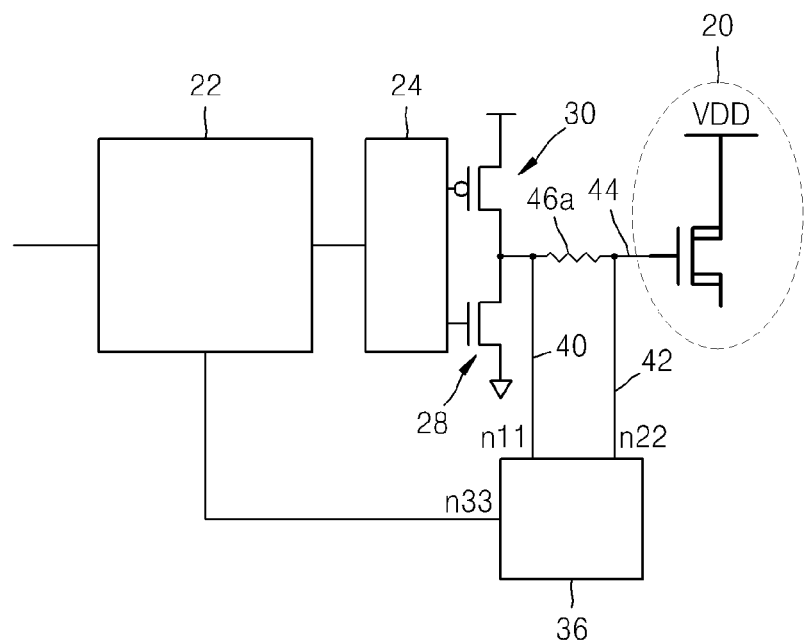
FIG. 3 is a diagram of the power device module of FIG. 2 where the voltage drop element includes a separate resistor according to an example embodiment.
Figure 4:
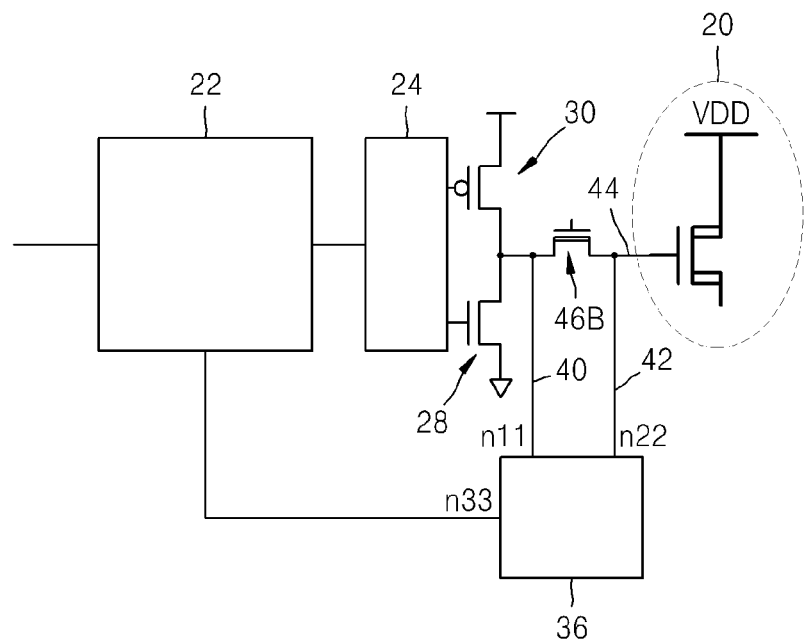
FIG. 4 is a diagram of the power device module of FIG. 2 where the voltage drop element includes a separate transistor according to an example embodiment.

The voltage drop element 46 may be, for example, a parasitic resistance, that is, a resistance of the element 44, such as the wiring itself. Alternatively, as illustrated in FIG. 3, the voltage drop element may be a separate resistor 46A. Likewise, as illustrated in FIG. 4, the voltage drop element may be a separate transistor 46B. A current may flow through the voltage drop element 46 according to a potential difference between two terminals of the voltage drop element 46. Therefore, the second gate leakage current detector 36 may be a detector that measures a current flowing through the element 44 by measuring voltages between both ends of the voltage drop element 46. When the voltage difference measured between the ends of the voltage drop element 46 reaches a desired (or, alternatively a predetermined) voltage or greater, the second gate leakage current detector 36 is configured to transmit a control signal to the control block 22.

Subsequent processes may be the same as described in FIG. 1.

In FIG. 2, the desired (or, alternatively the predetermined) voltage is a voltage at which the current flowing through the voltage drop element 46 is a desired (or, alternatively a predetermined) current. Here, the desired current is a current at which a leakage current from the power device 20 may have a desired (or, alternatively predetermined) value or greater. That is, when a current equal to or greater than the desired current is supplied to the power device 20, the leakage current of the power device 20 may have the desired value or greater. Components other than the power device 20 of FIGS. 1 and 2 are referred to as periphery components and are part of the periphery P.

Hereinafter, circuits of the gate leakage current detector 26 of FIG. 1 and the second gate leakage current detector 36 of FIG. 2 according to example embodiments will be described.

First, examples of the circuits of the gate leakage current detector 26 of FIG. 1 according to example embodiments will be described with reference to FIGS. 5 through 7.

Figure 5:
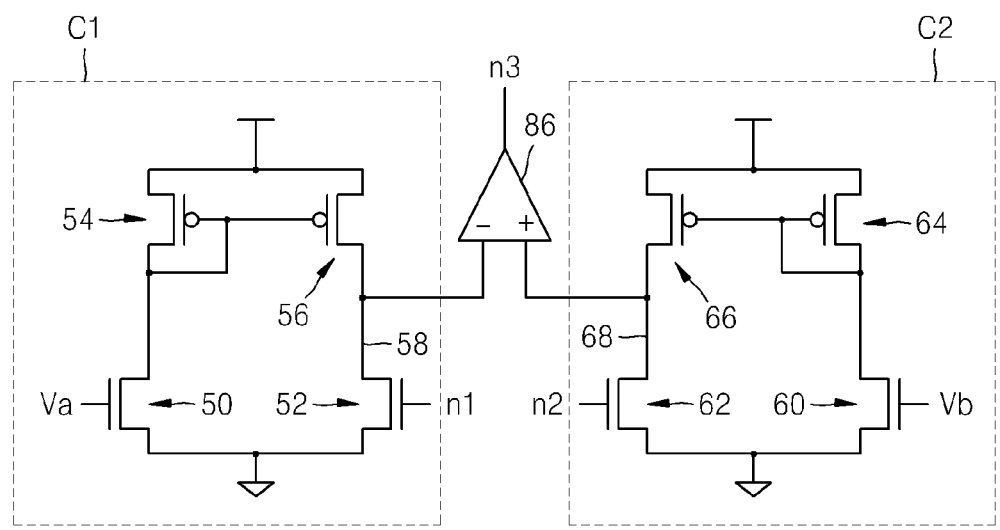
FIGS. 5 through 7 are circuits of the gate leakage current detector of FIG. 1 according to example embodiments.

FIG. 5 illustrates a circuit of the gate leakage current detector 26 of FIG. 1 according to an example embodiment.

Referring to FIG. 5, the gate leakage current detector 26 includes a first circuit unit C1, a second circuit unit C2, and a comparator 86. The second circuit unit C2 is connected to a positive (+) input terminal of the comparator 86, and the first circuit unit C1 is connected to a negative (−) input terminal of the comparator 86. The first circuit unit C1 includes first and second NMOS transistors 50 and 52, respectively, and first and second PMOS transistors 54 and 56, respectively.

Sources of the first and second NMOS transistors 50 and 52 are commonly grounded. Drains of the first and second PMOS transistors are commonly connected to a power supply. A drain of the first NMOS transistor 50 and a source of the first PMOS transistor 54 are connected. A drain of the second NMOS transistor 52 and a source of the second PMOS transistor 56 are connected. The negative (−) input terminal of the comparator 86 is connected to a wiring 58 that connects the second NMOS transistor 52 and the second PMOS transistor 56. Gates of the first and second PMOS transistors 54 and 56 are connected to each other and connected to the source of the first PMOS transistor 54. A first voltage Va is applied to a gate of the first NMOS transistor 50. A gate of the second NMOS transistor 52 is connected to the gate of the power device 20 and a gate voltage n1 is applied to the gate of the second NMOS transistor 52, and thus the gate voltage n1 is applied to the gate of the power device 20.

The second circuit unit C2 includes third and fourth NMOS transistors 60 and 62, respectively, and third and fourth PMOS transistors 64 and 66, respectively.

Sources of the third and fourth NMOS transistors 60 and 62 are commonly grounded. Drains of the third and fourth PMOS transistors 64 and 66, respectively, are commonly connected to a power supply. A drain of the third NMOS transistor 60 and a source of the third PMOS transistor 64 are connected. A drain of the fourth NMOS transistor 62 and a source of the fourth PMOS transistor 66 are connected.

In the second circuit unit C2, a second voltage Vb is applied to the third NMOS transistor 60. A gate of the fourth NMOS transistor 62 is connected to the source of the power device 20, and thus a source voltage n2 of the power device 20 is applied to the gate of the fourth NMOS transistor 62. The positive (+) input terminal of the comparator 86 is connected to a wiring 68 that connects the fourth NMOS transistor 62 and the fourth PMOS transistor 66.

The gate voltage n1 applied to the gate of the second NMOS transistor 52 of the first circuit unit C1 is always higher than the source voltage n2 applied to the gate of the fourth NMOS transistor 62, that is n1>n2. Accordingly, the first voltage Va of the first circuit unit C1 is maintained at a lower level than the second voltage Vb of the second circuit unit C2. Therefore, a voltage applied to the negative (−) input terminal of the comparator 86 and a voltage applied to the positive (+) input terminal of the comparator 86 may be maintained at same level until a difference between the gate voltage n1 applied to the gate of the power device 20 and the source voltage n2 applied to the source of the power device 20 reaches a voltage difference by which a leakage current equal to or greater than a critical leakage current is generated.

As the difference between the gate voltage n1 and the source voltage n2 reaches the voltage difference, the voltage applied to the negative (−) input terminal of the comparator 86 is increased. As a result, an output signal n3 of the comparator 86 is generated. The output signal n3 of the comparator 86 becomes an input signal of the control block 22. When the control block 22 receives the signal n3 from the comparator 86, the control block 22 turns off the operation of the gate driver 24.

Figure 6:
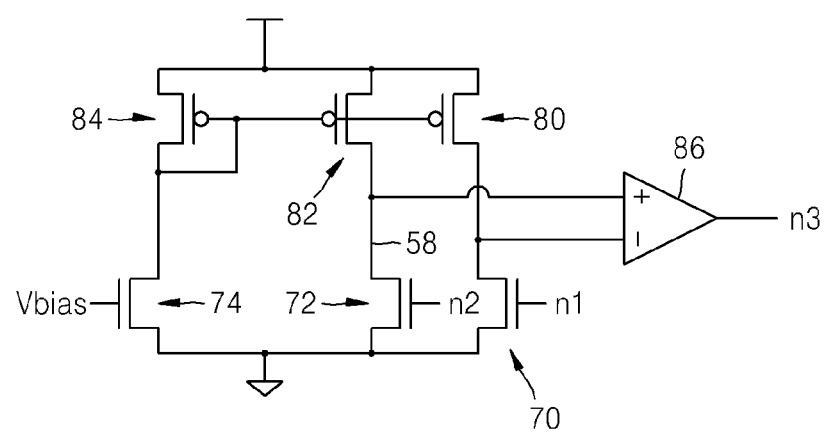

FIG. 6 illustrates a circuit of the gate leakage current detector 26 of FIG. 1 according to another example embodiment.

Referring to FIG. 6, the gate leakage current detector of FIG. 6 includes first through third NMOS transistors 70, 72, and 74, respectively, and first through third PMOS transistors 80, 82, and 84, respectively. Sources of the first through third NMOS transistors 70, 72, and 74 are commonly grounded. Drains of the first through third PMOS transistors 80, 82, and 84 are commonly connected to a power supply, and gates of the first through third PMOS transistors 80, 82, and 84 are connected to one another. Sources of the first through third PMOS transistors 80, 82, and 84 are respectively connected to drains of the first through third NMOS transistors 70, 72, and 74. The source of the third PMOS transistor 84 is connected to the gates of the first through third PMOS transistors 80, 82, and 84.

The positive (+) input terminal of the comparator 86 is connected to the drain of the second NMOS transistor 72 and the source of the second PMOS transistor 82. The negative (−) input terminal of the comparator 86 is connected to the drain of the first NMOS transistor 70 and the source of the first PMOS transistor 80.

A bias voltage Vbias is applied to a gate of the third NMOS transistor 74. A gate of the first NMOS transistor 70 is connected to the gate of the power device 20 and the gate voltage n1 is applied thereto, and thus the gate voltage n1 is applied to the power device 20. A gate of the second NMOS transistor 72 is connected to the source of the power device 20, and thus the source voltage n2 of the power device 20 is applied thereto. The gate voltage n1 is greater than the source voltage n2 (n1>n2).

A width W2 of a channel of the second NMOS transistor 72 may be greater than a width W1 of a channel of the first NMOS transistor 70 (W2>W1). Alternatively, a length L2 of the channel of the second NMOS transistor 72 may be shorter than a length L1 of the channel of the first NMOS transistor 70 (L2<L1). Therefore, a voltage applied to the negative (−) input terminal of the comparator 86 and a voltage applied to the positive (+) input terminal of the comparator 86 may be maintained at the same level until a difference between the gate voltage n1 and the source voltage n2 reaches a voltage difference by which a leakage current equal to or greater than a critical leakage current is generated.

The first and second NMOS transistors 70 and 72 may be formed by adjusting widths or lengths in consideration of the conditions mentioned above. As the difference between the gate voltage n1 and the source voltage n2 reaches the voltage difference, the voltage applied to the negative (−) input terminal of the comparator 86 is increased. As a result, the gate driver 24 may be turned off through the control block 22 in response to the output signal n3 generated by the comparator 86.

Figure 7:
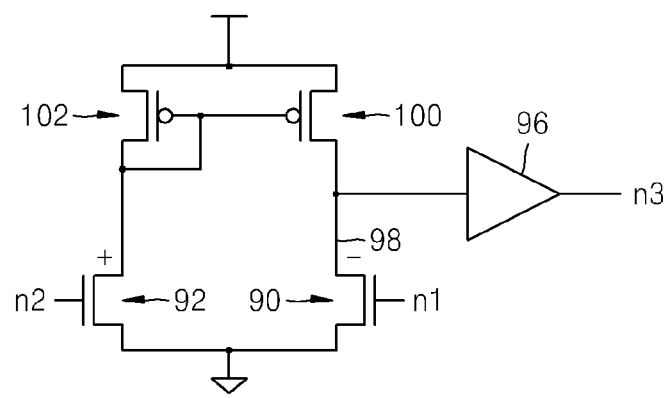

FIG. 7 illustrates a circuit of the gate leakage current detector 26 of FIG. 1 according to another example embodiment.

Referring to FIG. 7, the gate leakage current detector of FIG. 7 includes first and second NMOS transistors 90 and 92, respectively, first and second PMOS transistors 100 and 102, respectively, and a comparator 96. Sources of the first and second NMOS transistors 90 and 92 are commonly grounded. Drains of the first and second PMOS transistors 100 and 102 are commonly connected to a power supply. A drain of the first NMOS transistor 90 is connected to a source of the first PMOS transistor 100. A drain of the second NMOS transistor 92 is connected to a source of the second PMOS transistor 102. Gates of the first and second PMOS transistors 100 and 102 are connected to each other. The source of the second PMOS transistor 102 is connected to the gates of the first and second PMOS transistors 100 and 102. An input terminal of the comparator 96 is connected to the drain of the first NMOS transistor 90 and the source of the first PMOS transistor 100.

A gate of the first NMOS transistor 90 is connected to the gate of the power device 20 and the gate voltage n1 is applied thereto, and thus the gate voltage n1 is applied to the gate of the power device 20. A gate of the second NMOS transistor 92 is connected to the source of the power device 20, and thus the source voltage n2 of the power device 20 is applied to the gate of the second NMOS transistor 92. The gate voltage n1 is greater than the source voltage n2 (n1>n2).

Potentials at the drains of the first and second NMOS transistors 90 and 92 may maintain the same level until a difference between the gate voltage n1 and the source voltage n2 reaches a voltage difference by which a leakage current equal to or greater than a critical leakage current is generated. To accomplish this, a width W22 of a channel of the second NMOS transistor 92 may be greater than a width W11 of a channel of the first NMOS transistor 90 (W22>W11). Alternatively, a length L22 of the channel of the second NMOS transistor 92 may be shorter than a length L11 of the channel of the first NMOS transistor 90 (L22<L11). Therefore, the first and second NMOS transistors 90 and 92 may be formed by adjusting widths or lengths in consideration of the conditions mentioned above.

As the difference between the gate voltage n1 of the power device 20 and the source voltage n2 of the power device 20 reaches the voltage difference, the potential of the drain of the first NMOS transistor 90 is raised, and thus the output signal n3 is generated from the comparator 96, and the control block 22 may turn off the gate driver 24 in response to the output signal n3.

Figure 8:
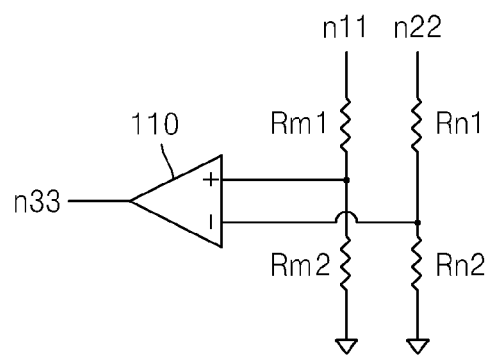
FIG. 8 is a circuit of the gate leakage current detector of FIG. 2 according to an embodiment.

FIG. 8 illustrates a circuit of the second gate leakage current detector 36 of FIG. 2 according to an example embodiment.

Referring to FIG. 8, the second gate leakage current detector includes a comparator 110, a first resistor Rm1, a second resistor Rm2, a third resistor Rn1, and a fourth resistor Rn2. A first terminal of the first resistor Rm1 is connected to both the drain of the first transistor 28 and the source of the second transistor 30 of FIG. 2, and a second terminal of the first resistor Rm1 is connected to a first terminal of the second resistor Rm2. Thus, a voltage n11 between the first and second transistors 28 and 30 is applied to the first terminal of the first resistor Rm1. A positive (+) input terminal of the comparator 110 is connected to the second terminal of the first resistor Rm1 and the first terminal of the second resistor Rm2.

A first terminal of the third resistor Rn1 is connected to the gate of the power device 20 and to a terminal of the voltage drop element 46 of FIG. 2. A second terminal of the third resistor Rn1 is connected to a first terminal of the fourth resistor Rn2. Thus, a voltage n22 at the gate of the power device 20 is applied to the first terminal of the third resistor Rn1. A negative (−) input terminal of the comparator 110 is connected to the second terminal of the third resistor Rn1 and the first terminal of the fourth resistor Rn2.

The voltage n22 applied to the first terminal of the third resistor Rn1 is less than the voltage n11 applied to the first terminal of the first resistor Rm1 (e.g., n22<n11). Voltages applied to the positive (+) input terminal and the negative (−) input terminal of the comparator 110 may be maintained at the same level until a difference between the voltage n11 and the voltage n22, that is, a potential difference between two terminals of the voltage drop element 46, reaches a desire (or alternatively, predetermined) potential difference. This may be accomplished by a resistance of the first resistor Rm1 being greater than a resistance of the third resistor Rn1 (e.g., Rm1>Rn1). Alternatively, a resistance of the second resistor Rm2 may be less than a resistance of the fourth resistor Rn2 (e.g, Rm2<Rn2).

As the potential difference of the two terminals of the voltage drop element 46 reaches the desired potential difference or more, the voltage applied to the input terminals of the comparator 110 is changed, and thus the control block 22 turns off the gate driver 24 in response to an output signal n33 transmitted from the comparator 110.

Resistance values of the first through fourth resistors Rm1, Rm2, Rn1, and Rn2 may be determined in consideration of the conditions mentioned above. Here, the desired potential difference may be a voltage at which an amount of current sufficient to generate a critical leakage current in the power device 20 may flow. That is, when a current is equal to or greater than a current corresponding to the desired potential difference is supplied to the power device 20, a leakage current generated from the power device 20 may have a value greater than a desired critical value.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A power module comprising:
a power device; and
a periphery circuit configured to suppress a leakage current in the power device, the periphery circuit including a leakage current detection circuit configured to detect a leakage current from the power device and control operation of the power device based on a result of the detection, the leakage current detection circuit including an input terminal connected to the power device, a plurality of NMOS transistors, a plurality of PMOS transistors connected to the plurality of NMOS transistors, and only one comparator connected to the plurality of NMOS transistors and the plurality of PMOS transistors, wherein
two NMOS transistors of the plurality of NMOS transistors are connected to the power device, and the two NMOS transistors of the plurality of NMOS transistors are connected to the only one comparator,
the input terminal includes a first input terminal connected to a gate of the power device and a second input terminal connected to a source of the power device, and the first input terminal is connected to a gate of a first one of the two NMOS transistors, and the second input terminal is connected to a gate of a second one of the two NMOS transistors.

2. The power module of claim 1, wherein the periphery circuit further includes,
a control block configured to generate a driver signal in response to a control signal,
a gate driver configured to selectively generate a driving voltage based on the driver signal, and
a Complementary Metal Oxide Semiconductor (CMOS) circuit configured to drive the power device based on the driving voltage.

3. The power module of claim 1, wherein the leakage current detection circuit comprises:
a first circuit unit connected to a first input terminal of the one comparator and a second circuit unit connected to a second input terminal of the one comparator.

4. The power module of claim 3, wherein the first circuit unit comprises:
two NMOS transistors and two PMOS transistors, wherein first reference voltage is applied to a gate of the remaining NMOS transistor.

5. The power module of claim 4, wherein the second circuit unit comprises:
two NMOS transistors and two PMOS transistors, wherein a second reference voltage lower than the first reference voltage is applied to a gate of the remaining NMOS transistor.

6. The power module of claim 1, wherein the leakage current detection circuit comprises:
three NMOS transistors and three PMOS transistors respectively connected to the three NMOS transistors, wherein a first one of the three NMOS transistors has a gate connected to the gate of the power device and a second one of the three NMOS transistors has a gate connected to the source of the power device, and a voltage applied to the gate of the first one of the three NMOS transistors is different from the voltage applied to the gate of the second one of the three NMOS transistors, and a bias voltage is applied to a gate of a third one of the three NMOS transistors.

7. The power module of claim 3, wherein the first circuit unit comprises:
a first NMOS transistor having a source, a drain and a gate, the gate of the first NMOS transistor connected to the gate of the power device and having a gate voltage applied thereto;
a second NMOS transistor having a source, a drain and a gate, the source of the second NMOS transistor connected to the source of the first NMOS transistor and the gate of the second NMOS transistor having a first reference voltage applied thereto;
a first PMOS transistor having a source connected to the drain of the first NMOS transistor; and
a second PMOS transistor having a source connected to the drain of the second NMOS transistor.

8. The power module of claim 7, wherein the second circuit unit comprises:
a third NMOS transistor having a source, a drain and a gate, the gate of the third NMOS transistor connected to the source of the power device and having a source voltage applied thereto;
a fourth NMOS transistor having a source, a drain and a gate, the source of the fourth NMOS transistor connected to the source of the third NMOS transistor and the gate of the fourth NMOS transistor having a second reference voltage applied thereto, the second reference voltage being a voltage level that is less than the first reference voltage;
a third PMOS transistor having a source connected to the drain of the third NMOS transistor; and
a fourth PMOS transistor having a source connected to the drain of the fourth NMOS transistor.

9. The power module of claim 1, wherein the leakage current detection circuit comprises:
a first, second and third NMOS transistor;
a first PMOS transistor connected to the first NMOS transistor;
a second PMOS transistor connected to the second NMOS transistor; and
a third PMOS transistor connected to the third NMOS transistor, wherein
a first input of the one, comparator is connected to the first NMOS transistor and the first PMOS transistor and a second input of the one comparator is connected to the second NMOS transistor and the second PMOS transistor, and
the first NMOS transistor has a gate connected to the gate of the power device and the second NMOS transistor has a gate connected to the source of the power device, and a voltage applied to the gate of the first NMOS transistor is different from the voltage applied to the second NMOS transistor, and
a bias voltage is applied to a gate of the third NMOS transistor.

10. The power module of claim 9, wherein a width of a channel of one of the first NMOS transistor and the second NMOS transistor having a greater voltage applied thereto is less than the width of the channel of a remaining one of the first NMOS transistor and the second NMOS transistor.

11. The power module of claim 9, wherein a length of a channel of one of the first NMOS transistor and the second NMOS transistor to which a greater voltage is applied is longer than the length of the channel of a remaining one of the first NMOS transistor and the second NMOS transistor.

12. The power module of claim 1, wherein the leakage current detection circuit comprises:
a first and second NMOS transistor;
a first PMOS transistor connected to the first NMOS transistor; and
a second PMOS transistor connected to the second NMOS transistor, wherein
the one comparator has one input terminal, and the first PMOS transistor and the first NMOS transistor are connected to the one input terminal of the one comparator.

13. The power module of claim 12, wherein a width of a channel of one of the first NMOS transistor and the second NMOS transistor having a greater voltage applied thereto is less than the width of the channel of a remaining one of the first NMOS transistor and the second NMOS transistor.

14. The power module of claim 13, wherein a length of a channel of one of the first NMOS transistor and the second NMOS transistor having a greater voltage applied thereto is longer than the length of the channel of the remaining one of the first NMOS transistor and the second NMOS transistor.

* * * * *